(12) United States Patent
Hauser et al.

(10) Patent No.: US 6,906,928 B2
(45) Date of Patent: Jun. 14, 2005

(54) ELECTRONIC COMPONENT WITH A SEMICONDUCTOR CHIP, AND METHOD OF PRODUCING THE ELECTRONIC COMPONENT

(75) Inventors: Christian Hauser, Regensburg (DE); Martin Reiss, Regensburg (DE)

(73) Assignee: Infineon Technologies AG, Munich (DE)

( * ) Notice: Subject to any disclaimer, the term of this patent is extended or adjusted under 35 U.S.C. 154(b) by 121 days.

(21) Appl. No.: 10/114,794

(22) Filed: Apr. 2, 2002

(65) Prior Publication Data

US 2002/0149917 A1 Oct. 17, 2002

(30) Foreign Application Priority Data

Apr. 2, 2001 (DE) .......................................... 101 16 069

(51) Int. Cl.[7] .................................................. H05K 1/18
(52) U.S. Cl. ...................................... 361/764; 361/761
(58) Field of Search ................................. 361/760–764, 361/780–795; 257/684, 668–670, 691–693, 700, 706, 710–718; 438/106, 112, 22, 26, 127; 174/260–266

(56) References Cited

U.S. PATENT DOCUMENTS

| | | |
|---|---|---|
| 4,001,870 A | 1/1977 | Saiki et al. |
| 4,074,342 A | 2/1978 | Honn et al. |
| 4,365,264 A | 12/1982 | Mukai et al. |
| 4,618,878 A | 10/1986 | Aoyama et al. |
| 4,740,700 A | 4/1988 | Shaham et al. |
| 4,813,129 A | 3/1989 | Karnezos |
| 4,885,126 A | 12/1989 | Polonio |
| 4,902,606 A | 2/1990 | Patraw |
| 5,072,520 A | 12/1991 | Nelson |
| 5,104,811 A * | 4/1992 | Berger et al. ............... 436/164 |
| 5,148,265 A | 9/1992 | Khandros et al. |
| 5,148,266 A | 9/1992 | Khandros et al. |
| 5,180,311 A | 1/1993 | Schreiber et al. |
| 5,196,371 A | 3/1993 | Kulesza et al. |
| 5,420,329 A | 5/1995 | Zeiss |
| 5,455,390 A | 10/1995 | DiStefano et al. |
| 5,489,749 A | 2/1996 | DiStefano et al. |
| 5,491,302 A | 2/1996 | Distefano et al. |
| 5,508,228 A | 4/1996 | Nolan et al. |
| 5,583,378 A * | 12/1996 | Marrs et al. ................. 257/710 |
| 5,604,380 A | 2/1997 | Nishimura et al. |
| 5,619,017 A | 4/1997 | Distefano |

(Continued)

FOREIGN PATENT DOCUMENTS

| | | |
|---|---|---|
| DE | 196 39 934 A1 | 4/1998 |
| JP | 04 280 458 | 10/1992 |
| WO | WO 98/50950 | 11/1998 |
| WO | WO 98/52225 | 11/1998 |
| WO | WO 98/55669 | 12/1998 |

OTHER PUBLICATIONS

Anonymous: "Method of Testing Chips and Joining Chips to Substrates", *XP-000169195*.
Patent Abstracts of Japan No. 20–00156435 A (Yoshitaka et al.), dated Jun. 6, 2000.

*Primary Examiner*—Kamand Cuneo
*Assistant Examiner*—Tuan Dinh
(74) *Attorney, Agent, or Firm*—Laurence A. Greenberg; Werner H. Stemer; Gregory L. Mayback

(57) ABSTRACT

The electronic component has a semiconductor chip mounted to a wiring board. The chip is bonded to the wiring board with adhesive strips that leave free a through-cutout, an additional cutout, and separating joints. The additional cutout provides for a plastic reservoir from which the separating joint between the adhesive strips is filled with plastic material.

22 Claims, 7 Drawing Sheets

U.S. PATENT DOCUMENTS

| | | | |
|---|---|---|---|
| 5,661,086 A | * | 8/1997 | Nakashima et al. ........ 257/668 |
| 5,666,270 A | | 9/1997 | Matsuda et al. |
| 5,679,977 A | | 10/1997 | Khandros et al. |
| 5,749,997 A | | 5/1998 | Tang et al. |
| 5,777,379 A | | 7/1998 | Karavakis et al. |
| 5,783,465 A | | 7/1998 | Canning et al. |
| 5,874,782 A | | 2/1999 | Palagonia |
| 5,907,785 A | | 5/1999 | Palagonia |
| 6,013,946 A | * | 1/2000 | Lee et al. .................... 257/684 |
| 6,091,140 A | * | 7/2000 | Toh et al. .................... 257/691 |
| 6,175,159 B1 | | 1/2001 | Sasaki |
| 6,268,650 B1 | * | 7/2001 | Kinsman et al. ............ 257/691 |
| 6,284,563 B1 | | 9/2001 | Fjelstad |
| 6,319,564 B1 | | 11/2001 | Naundorf et al. |
| 6,630,730 B2 | * | 10/2003 | Grigg ......................... 257/684 |

* cited by examiner

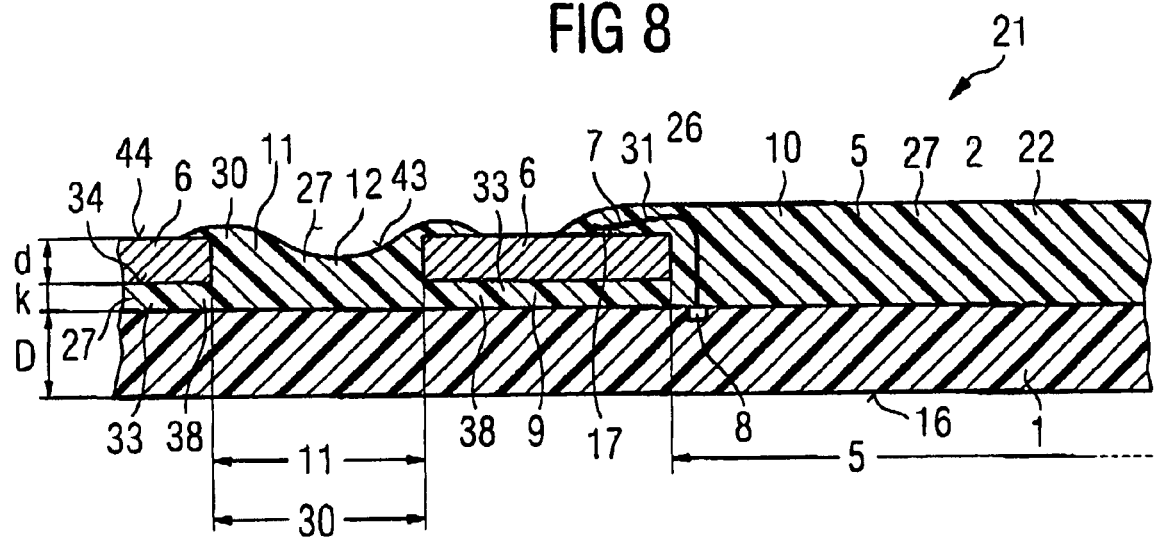

ELECTRONIC COMPONENT WITH A SEMICONDUCTOR CHIP, AND METHOD OF PRODUCING THE ELECTRONIC COMPONENT

BACKGROUND OF THE INVENTION

Field of the Invention

The invention relates to an electronic component with a semiconductor chip, and to a method for the production of the electronic component.

In the production of electronic components with semiconductor chips, increasing use is made of surrounding wiring boards, which are adhesively joined to the active upper face of the semiconductor chip leaving free a through-cutout. The through-cutout is in this case used to provide a bonding channel, so that, after being adhesively joined, bonding wires from contact surfaces on the semiconductor chip can be bonded to contact connecting surfaces on the surrounding wiring board. After the adhesive joining process and the application of the bonding connection, the bonding channel and the through-cutout in the surrounding wiring board are covered with a plastic compound.

As the chip size increases, it becomes more problematic to cover the bonding channel during the application of the plastic compound to the bonding channel, in that a considerable loss of plastic compound occurs on the transverse faces of the bonding channel as a result of which bonding wires or bonding connections in this region are exposed, and are not reliably covered by the plastic compound. Components with such faults must be segregated out, since the exposed bonding connections decrease the probability of reliable operation.

SUMMARY OF THE INVENTION

It is accordingly an object of the invention to provide an electronic component with a semiconductor chip and to a method for the production thereof, which overcomes the above-mentioned disadvantages of the heretofore-known devices and methods of this general type and which avoids such reject production and counteracts the reasons for the exposure of the bonding connections on the transverse faces of the bonding channel and of the through-cutout.

With the foregoing and other objects in view there is provided, in accordance with the invention, an electronic component, comprising:

a wiring board formed with a through-cutout;

a semiconductor chip having an active upper face and contact surfaces on the active upper face;

adhesive strips on the active upper face of the semiconductor chip and mounting the semiconductor chip to the wiring board for bonding connections to the contact surfaces, the adhesive strips leaving free the through-cutout in the wiring board, and leaving free elongated separating joints between the adhesive strips on the wiring board; and a plastic cover embedding the bonding connections and filling the separating joints, and the surrounding wiring board having formed therein an additional cutout, with a plastic reservoir, adjoining the separating joints.

In other words, the objects of the invention are achieved with the electronic component that has a semiconductor chip with an active upper face carrying adhesive strips, by means of which the active upper face of the semiconductor chip is mounted on the upper face of the surrounding wiring board. The surrounding wiring board itself has a through-cutout, which exposes contact surfaces on the active upper face of the semiconductor chip. In the process, a separating joint at the same time remains between the adhesive strips, and connects the active upper face of the semiconductor chip to the upper face of the surrounding wiring board. In this invention, the volume of the separating joint is filled with plastic compound from a plastic reservoir in an additional cutout in the surrounding wiring board. The plastic cover thus embeds not only the bonding connections in the through-cutout, but in addition, a plastic reservoir in an additional cutout also supplies plastic compound to the through-cutout in the surrounding wiring board. The cavity which is formed from the two adhesive strips in the form of a separating joint and between the upper faces of the semiconductor chip and the surrounding wiring board is thus completely filled with a plastic compound.

As a result of the provision of an additional cutout with a plastic reservoir, the electronic component according to the invention has the advantage that the bonding connections remain embedded in the plastic compound, and only the plastic reservoir in the additional cutout that is provided is partially or entirely consumed in order to fill the separating joints. This ensures that the plastic cover reliably embeds the bonding connections in the plastic compound in these electronic components, thus making it possible to reduce the amount of scrap when such electronic components are packaged using a plastic housing, since no bonding connections are exposed.

In accordance with an added feature of the invention, the semiconductor chip has edge faces as well as a passive rear face opposite the active upper face, with the contact surfaces having on the upper face a structure arrangement to which the through-cutout in the surrounding wiring board is matched. The through-cutout is thus clearly provided only for the structure arrangement of the contact surfaces and thus for the embedding of the bonding connection in plastic compound, and is functionally and physically separated from the filling of the separating joints between the adhesive strips. Bonding connections can thus be provided on the longitudinal faces of the through-cutout and these bonding connections have completely constant and standard bonding wire lengths, thus allowing rapid and reliable bonding.

In accordance with an additional feature of the invention, the through-cutout is combined with the additional cutout by, for example, lengthening the longitudinal extent of the through-cutout. Such an additional extension, which is free of bonding wires, can now use its plastic reservoir to supply plastic compound to the separating joints between the adhesive strips, without the bonding connections being partially exposed. Such extensions of the through-cutouts for bonding channels may assume various shapes.

In accordance with another feature of the invention, the through-cutout in the surrounding wiring board has longitudinal faces with bonding connections, and transverse faces without bonding connections, with the transverse faces each being enlarged by an additional cutout with a plastic reservoir. The separating joints, which are filled with plastic compound, between the adhesive strips are physically adjacent to this plastic reservoir, in the longitudinal direction. Such separating joints between the plastic strips are dependent on the fabrication process, since the plastic strips are stamped from a large-area plastic tape during production of the electronic component and holding webs composed of plastic tape material support the material of the through-cutout and separate it from the adhesive strips, which are produced from the adhesive tape and are arranged between the semiconductor chip and the surrounding wiring board.

In the present embodiment, the transverse faces of the through-cutout can not be provided with any bonding connection, since the transverse faces in this case bound the additional cutout and the additional cutout with the plastic reservoir must remain free of bonding connections in order that the latter are not exposed while the bonding connections are being embedded in the plastic compound, when the plastic compound at the same time fills the separating joints between the adhesive strips.

In accordance with a further feature of the invention, the additional cutout is an extension of the through-cutout, i.e., it is integrally and commonly formed with the through-cutout, which tapers in the longitudinal direction of the through-cutout. Since experiments have shown that it is not essential for the full width of the through-cutout to be lengthened in the longitudinal direction in order to fill the entire separating joint with plastic compound, this embodiment of the invention has a better-matched plastic reservoir, which has a reduced plastic reservoir as the through-cutout is increasingly lengthened in the region of the additional cutout.

In accordance with again a further embodiment of the invention, the additional cutout may also be in the form of an extension which narrows in the longitudinal direction of the through-cutout. In this case, the extension and the narrowing are designed such that the plastic reservoir is now just sufficient to fill the separating joints between the adhesive strips.

A further embodiment of the invention provides for the additional cutout to be arranged separately from the through-cutout. This has the advantage that the transverse faces of the through-cutout are available for application of bonding connections. The through-cutout in this embodiment of the invention thus has longitudinal faces with bonding connections, and transverse faces with bonding connections, while the additional cutout with a plastic reservoir in the region of the separating joints is arranged separately from the through-cutout. Since the plastic reservoir in the region of the separating joints is provided with an additional cutout in the surrounding wiring board, this ensures that the separating joints are completely filled with plastic compound without the plastic compound being consumed in the through-cutout, which is then used entirely and solely for embedding bonding connections. It is also advantageous for the additional cutout to be arranged physically separately from the through-cutout, since the bonding connections comprising bonding wires may now have standard bonding wire lengths not only on the longitudinal faces but also on the transverse faces of the through-cutout. Standard bonding wire lengths both in the longitudinal direction and in the transverse direction, and hence both on the longitudinal faces and on the transverse faces of the through-cutout, make it possible for the bonding process to be carried out more reliably and more quickly.

In accordance with again an added feature of the invention, the adhesive strips themselves are adhesive material which provides adhesion on both sides. This adhesive material which provides adhesion on both sides may be composed entirely of an adhesive throughout its entire thickness. In a further embodiment of the invention, the adhesive strips are composed of a base material with a double-sided adhesive coating. This results firstly in a considerable saving of adhesive while, secondly, the base material can be better matched to the requirement for the semiconductor chip material and for the surrounding wiring board material, in particular with respect to the different expansion characteristics of these materials.

The adhesive strips have a thickness of between 40 $\mu$m and 200 $\mu$m for this purpose. The greater the difference in the expansion between the chip material and the surrounding wiring board material, the thicker the adhesive strips are made and, as the adhesive strip thickness is increased, a change is made to a combination of the base material and adhesive coating. The surrounding wiring board in a further embodiment of the invention has a thickness of 150 $\mu$m to 350 $\mu$m. The object of the surrounding wiring board is to transmit the electrical signals and supply currents for the semiconductor chip from microscopically small contact connecting surfaces via interconnects to macroscopic external contact surfaces. In this context, the expression microscopically small dimensions should be regarded as meaning structures which can be measured only by using an optical microscope, while the expression macroscopic relates to structures which can be measured using the naked eye.

In accordance with again an additional feature of the invention, the surrounding wiring board comprises a fiber-reinforced plastic board with a metal coating which is structured to form contact connecting surfaces, surrounding wiring lines and external contact surfaces. Owing to the fiber reinforcement, this embodiment has the advantage that the surrounding wiring board can withstand the high injection pressure with relatively stable dimensions when the electronic component is being packaged in a plastic housing. This injection pressure is in the order of magnitude of 8 MPa to 15 MPa. The structured metal coating is in this case applied to the lower face of the surrounding wiring board, with solder resist being used to provide protection against metallization during the soldering of the external contacts. Only the external contact surfaces are kept free of both solder resist and plastic compound until the external contacts have been applied.

In accordance with again a further feature of the invention, the metal coating is composed of copper or a copper alloy. This has the advantage that the metal coating can be applied electrochemically to the fiber-reinforced plastic of the surrounding wiring board, and the copper represents a relatively low-cost metal coating in terms of the material costs.

Since copper surfaces oxidize easily and are therefore not particularly suitable either for bonding or for soldering, the contact connecting surfaces on which bonding connections are to be produced and the external contact surfaces to which external contacts are to be soldered are equipped with a coating which can be bonded or soldered, in a further embodiment of the invention.

A method for producing an electronic component, which comprises the following method steps:

providing a wiring board with a through-cutout and an additional cutout;

applying two adhesive strips to the wiring board and thereby leaving free the through-cutout, the additional cutout, and elongated separating joints between the adhesive strips;

applying a semiconductor chip to the adhesive strips, and thereby positioning contact surfaces of the semiconductor chip in the through-cutout in the wiring board;

constructing bonding connections between the contact surfaces on the semiconductor chip and contact connecting surfaces on the wiring board; and filling the through-cutout, the additional cutout, and the separating joints with a plastic compound and thereby embedding the bonding connections.

The novel method has the advantage that the plastic compound for the through-cutout need embed only the bonding connections, and does not also have to fill the separating joint between the plastic strips with plastic compound. This avoids a reduction in the amount of plastic compound in the region of the through-cutout for the bonding connections. In fact, a plastic reservoir is provided in an additional cutout in the surrounding wiring board in order fill the separating joints between the plastic strips, and this is at least partially consumed for the filling process. This ensures that no failures can occur during packaging of electronic components as a result of any lack of plastic compound in the region of the bonding connections. At the same time, this embodiment of the invention ensures that it is possible to use such methods for semiconductor chips with any desired length extent, that is to say for semiconductor chips whose length extent is considerably greater than the required length for a bonding channel.

As circuits become increasingly miniaturized and as the integration level on semiconductor chips increases, ever fewer contact surfaces can be accommodated in the bonding channels, so that although the chip length grows, the bonding channels themselves do not increase significantly. However, instead, there is an increase in the requirement for plastic compound for filling separating joints between adhesive strips which are required in order to adhesively join the semiconductor chip to a surrounding wiring board. With the method according to the invention, the volume of these separating joints is supplied from an additional plastic reservoir, so that there is no lack of plastic for covering the bonding channel with plastic compound.

One exemplary embodiment of the invention provides for the adhesive strips to be stamped out from a double-sided adhesive tape. In this case the adhesive tape has holding webs after the stamping-out process, which holding webs hold that part of the stamped-out adhesive tape which is required for leaving free the through-cutout and the additional cutouts. The sizes of the holding webs correspond to the separating joints. This exemplary embodiment of the method takes account of the fact that the adhesive strips are not prepared and applied to the surrounding wiring board individually but that the adhesive strips are pressed directly from an adhesive tape onto the surrounding wiring board, while at the same time holding back those parts of the adhesive tape which are superfluous and do not need to be positioned on the surrounding wiring board. These are held by thin holding webs. These holding webs cause the separating joints between the adhesive strips and form cavities between the semiconductor chip and the surrounding wiring board. During the process of filling with plastic compound, these cavities are once again the cause of the previous problems, which are now solved by the method according to the invention, wherein a plastic reservoir is provided for the separating joints.

A further exemplary embodiment of the method provides that, during the process of filling the separating joints with plastic compound, the liquid plastic compound from the plastic reservoir in the additional cutouts is introduced by means of the capillary effect into the space between the active upper face of the semiconductor chip and the upper face of the surrounding wiring board in the region of the separating joints. This capillary effect can be utilized only when the wetting characteristics between the liquid plastic compound and the material of the semiconductor chip, as well as the material of the surrounding wiring board, allow this. If this were not the case, it would be necessary to fill the intermediate space by applying a correspondingly high pressure to the liquid plastic material. In both cases, however, this method results in an electronic component wherein the separating joints are filled with plastic compound without any bonding connections being exposed in the process.

In accordance with again a further exemplary embodiment of the method, bonding connections are applied to the longitudinal faces and to the transverse faces of a bonding channel while maintaining standard bonding wire lengths. This can be done only when additional cutouts are at the same time arranged on the surrounding wiring board such that they do not lengthen the through cut-out for the bonding channel but are introduced into the surrounding wiring board completely separately from the bonding channel in the region of the separating joints.

In summary, it can be stated that problems occur with the housings for long semiconductor chips with bonding channels that are at the same time short, since the production processes result in the creation of cavities in the package and/or in the packaging. These cavities consume a considerable proportion of the plastic compound, in comparison to the length of the bonding channels, as the length of the chips increases, while this plastic compound is actually intended for covering the bonding channels during the packaging of the components in plastic housings. The configuration of the bonding channels should thus be adapted such that the position of the chip pads or contact surfaces on the semiconductor chip, the routing of the interconnects and/or the profile of the interconnects as well as the process management during the covering process and packaging process and during the via bonding process and the process for producing bonding connections are taken into account. These problems are solved by one embodiment of the invention in that the bonding channel is lengthened. The extension may have a bonding region which becomes narrower so that the bonding wire connections can be applied to narrow faces without being exposed during the subsequent packaging process. The tapering or narrowing extension of a through-cutout in the surrounding wiring board thus results in an optimum covering process with plastic, by creating an additional plastic reservoir in the extension region.

On the one hand, the tapering or narrowing, together with simultaneous lengthening of the bonding channel, result in shifted edge regions of the bonding channel, which can be used for bonding connections and, on the other hand, a reservoir of plastic is produced for the cavities created by the separating joint between the adhesive strips. In addition to pure lengthening, constriction or tapering of the bonding channel, additional, separate cutouts with an elongated or circular shape can also be provided in the surrounding wiring board and/or a substrate, in order to be used as a reservoir for the plastic compound which is to be applied for the cavities. In this case, the entire transverse face of a bonding channel can advantageously be used for the application of bonding wires, since the encapsulate now provides a physically separate additional reservoir for filling the cavities.

The present invention thus provides the following advantages:
  bonding is also additionally possible on the transverse faces of the bonding channel, without reducing the amount of plastic compound on these bonding connections;
  the extension of the bonding channel can at the same time be provided for improved process management during printing and dispensing (provision of the plastic compound);

additional cutouts in the laminate or in the surrounding wiring board allow cavities in the electronic component to be filled independently of the plastic covering on the bonding channel;

chips with relatively narrow bonding pitches or step widths between the contact surfaces on the semiconductor chip can be bonded reliably, thus assisting further miniaturization;

the design according to the invention allows improved process management and increased package reliability;

finally, no additional process steps are required, since the additional cutout for spare plastic can be incorporated into the surrounding wiring board by stamping or milling at the same time as the through-cutout for the bonding channel, so that no additional costs are required for additional method steps.

Other features which are considered as characteristic for the invention are set forth in the appended claims.

Although the invention is illustrated and described herein as embodied in electronic component with a semiconductor chip, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8 shows a schematic cross section through the sixth embodiment of the invention, taken along the section line C—C in FIG. 7 and viewed in the direction of the arrows.

DESCRIPTION OF THE PREFERRED EMBODIMENTS

Figure 1:
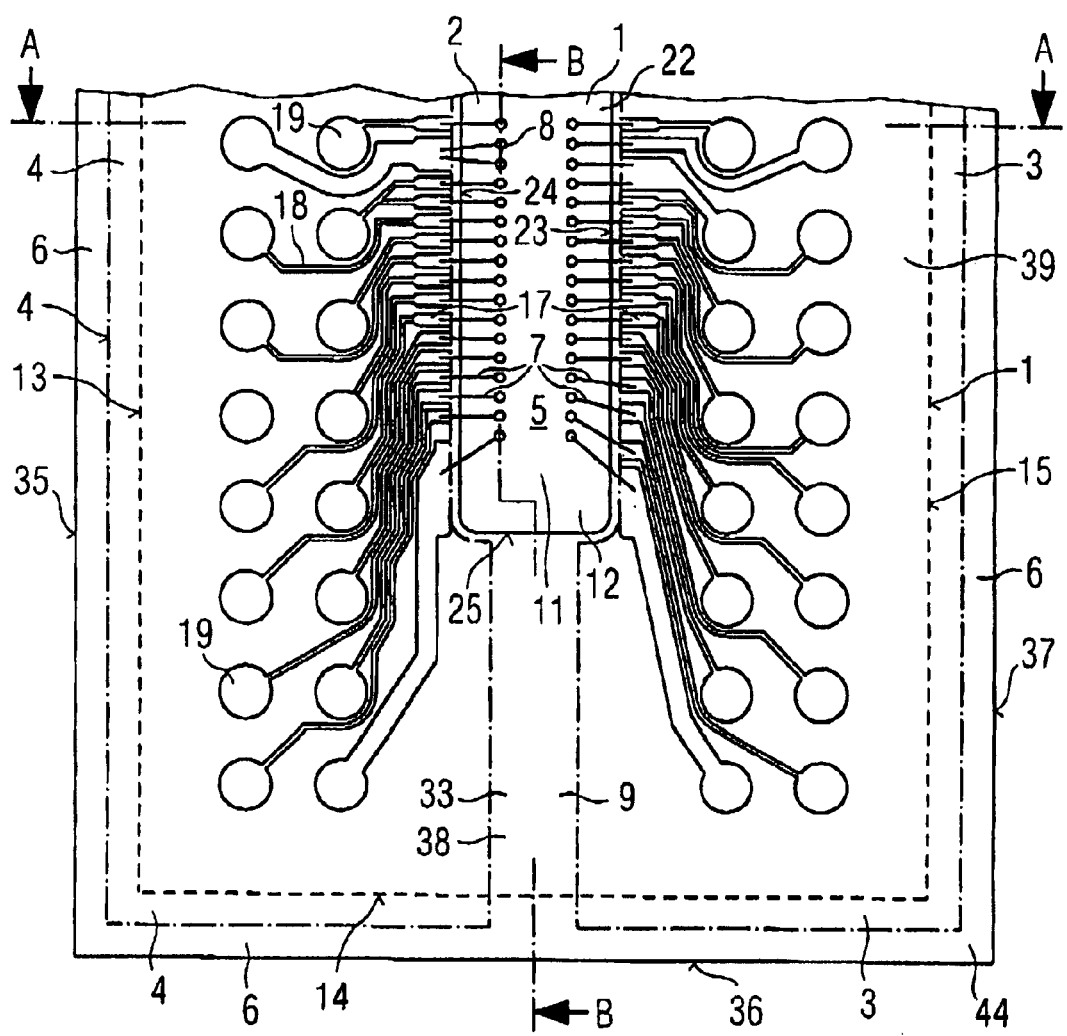
FIG. 1 is a schematic view of the lower face of a first embodiment of an electronic component according to the invention.

Referring now to the figures of the drawing in detail and first, particularly, to FIG. 1 thereof, there is shown a schematic view of the lower face 39 of a first embodiment of an electronic component according to the invention, without any plastic cover on a through-cutout 5 for a bonding channel 22 and on an additional cutout 11 for a plastic reservoir 12 which has been provided, and without any external contacts. The lower face 39 of the electronic component is formed by a surrounding wiring board 6, which is bounded by the edges 35, 36 and 37. The dashed-dotted lines are the edges of two adhesive strips 3 and 4 and the dashed line indicates the area of the semiconductor chip 1 with its edges 13, 14 and 15. The active upper face of the semiconductor chip 1 can be seen in the region of the through-cutout 5 in FIG. 1, since this through-cutout 5 is incorporated in the surrounding wiring board 6 and, in order to simplify the illustration, no plastic cover has yet been applied to the through-cutout 5. The arrangement of contact surfaces 8 on the semiconductor chip 1 can thus be seen on the active upper face 2 in the through-cutout 5. These contact surfaces 8 are microscopically small, so that they cannot be measured with the naked eye, and have dimensions which can be identified only by using an optical microscope. These contact surfaces 8 in the through-cutout 5 are bonding connections 7 connected to contact connecting surfaces 17 on the lower face 44 of the surrounding wiring board 6. The contact connecting surfaces 17 on the surrounding wiring board 6 also have microscopically small dimensions and are connected via surrounding wiring lines 18 to external contact surfaces 19, which have macroscopic dimensions, that is to say dimensions which can be measured with the naked eye. External contacts can be applied to these external contact surfaces 19, but are not shown in the illustration in FIG. 1.

The semiconductor chip 1 is connected by its active upper face 2 on the surrounding wiring board 6 by means of adhesive strips 3 and 4 arranged in between. These adhesive strips 3 and 4 are separated from one another by a separating joint 9, so that an additional cavity 38 is formed between the semiconductor chip 1 and the surrounding wiring board 6, and can be filled with plastic material during the coverage of the through-cutout 5 with the additional cutout 11. This additional cutout 11 in the first embodiment of the invention as is shown in FIG. 1, is an extension of the bonding channel 22 and thus forms a plastic reservoir, which can fill the cavity 38, which is formed by the separating joint 9, without any bonding connections 7 being exposed.

In this embodiment of the invention, the bonding channel 22 is extended over its entire width for the additional cutout 11, so that the bonding connections 7 in the end regions of the bonding channel 2 are longer than the other bonding connections 7 so that it is impossible for there to be a standard bonding wire length for all the bonding connections 7. Furthermore the transverse face 25 cannot be used for bonding connections, since the plastic reservoir for filling the cavity 38 is provided in the region of this transverse face 25.

Figure 2:
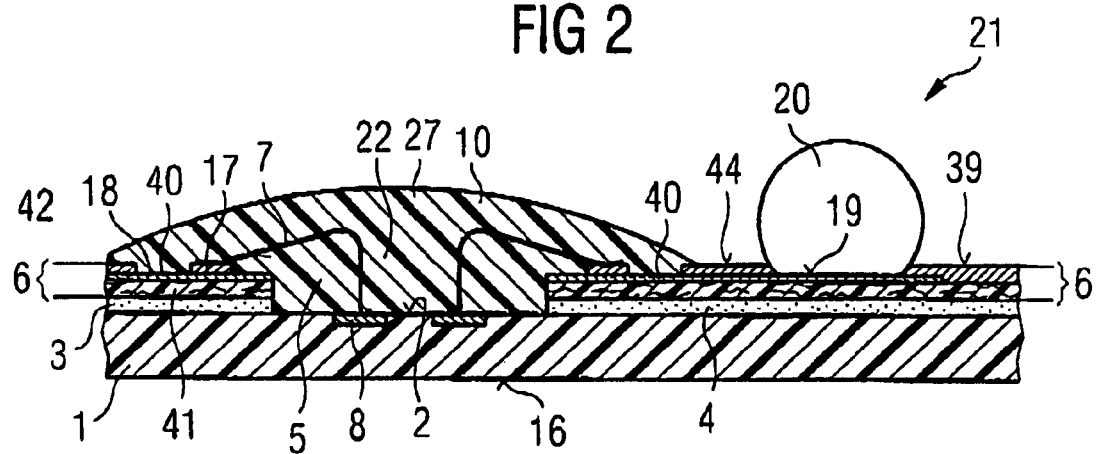
FIG. 2 is a schematic cross section through the first embodiment of the electronic component, taken along the section line A—A in FIG. 1 and viewed in the direction of the arrows.

FIG. 2 shows a schematic cross section through the first embodiment of the electronic component 21 along the section line A—A in FIG. 1, but already having a plastic cover 10. Components which carry out the same functions as in FIG. 1 are identified by the same reference symbols and will not be explained again. The cross section in FIG. 2 along the section line A—A in FIG. 1 shows the basic concept of an electronic component 21 as a BOC component (Board on Chip). The lower face 39 of the electronic component 21 is at the same time the lower face 44 of the surrounding wiring board 6 which is composed of three layers, namely a fiber-reinforced plastic board 41, a structured copper or copper alloy coating 40 and a structured solder resist layer 42.

As is shown in FIG. 1, the structured copper coating 40 has contact connecting surfaces 17, surrounding wiring lines 18 and external contact surfaces 19. The structured solder resist layer 42 leaves free the external contact surfaces 19 and the contact connecting surfaces 17, so that an external contact 20 in the form of a contact ball or contact stud can be applied to the external contact surfaces. Bonding connections 7 can be applied to the contact connecting surfaces 17 that have been kept free, connecting the contact connecting surfaces 17 to contact surfaces 8 on the active upper face 2 of the semiconductor chip 1. The plastic cover 10 protects the bonding connections 7 against mechanical and corrosive damage. The external contact 20 in this embodiment of the invention is higher than the plastic cover 10, in order to ensure that the external contact 20 projects sufficiently above the lower face 39 of the electronic component 21 in order to make contact.

Figure 3:
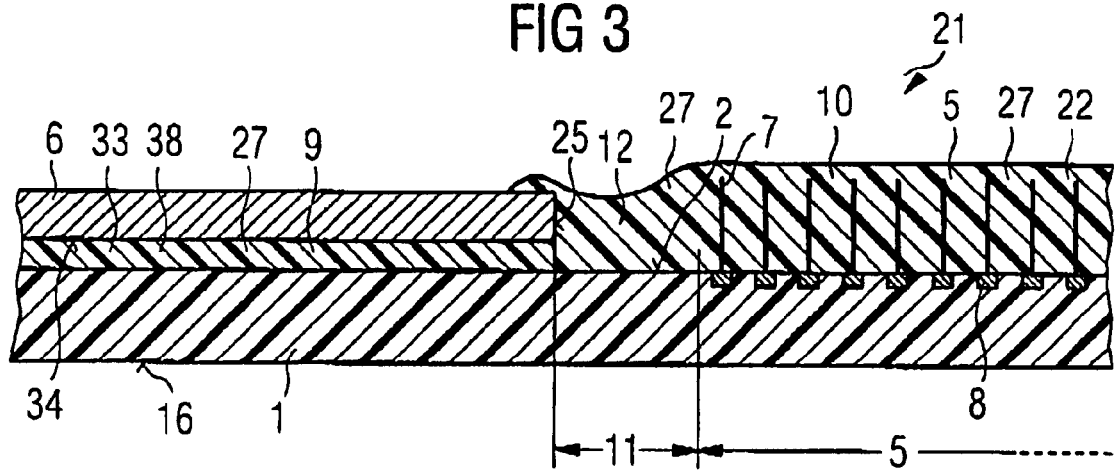
FIG. 3 is a schematic cross section through the first embodiment of the electronic component, taken along the section line B—B in FIG. 1 (and FIGS. 4, 5) and viewed in the direction of the arrows.

FIG. 3 shows a schematic cross section through the first embodiment of the electronic component 21 along the section line A—A in FIG. 1, but already having the plastic cover 10. Components which carry out the same functions as in FIGS. 1 and 2 are identified by the same reference symbols and will not be explained again. Since the section line B—B in FIG. 1 is located along the separating joint 9 between the adhesive strips 3 and 4, the adhesive strips cannot be seen in FIG. 3, but rather the plastic compound 27, which is supplied by means of the capillary effect from the additional cutout 11 during the process of covering the additional cutout with plastic from the plastic reservoir 12. The filling of the cavity 28 between the surrounding wiring board 6 and the semiconductor chip in the region of the separating joint 9 consumes only a portion of the plastic compound 27 in the plastic reservoir 12, and none of the plastic compound of the through-cutout 5, which is intended for the bonding connections 7, so that all the bonding connections 7 remain embedded in the plastic compound.

Figure 4:
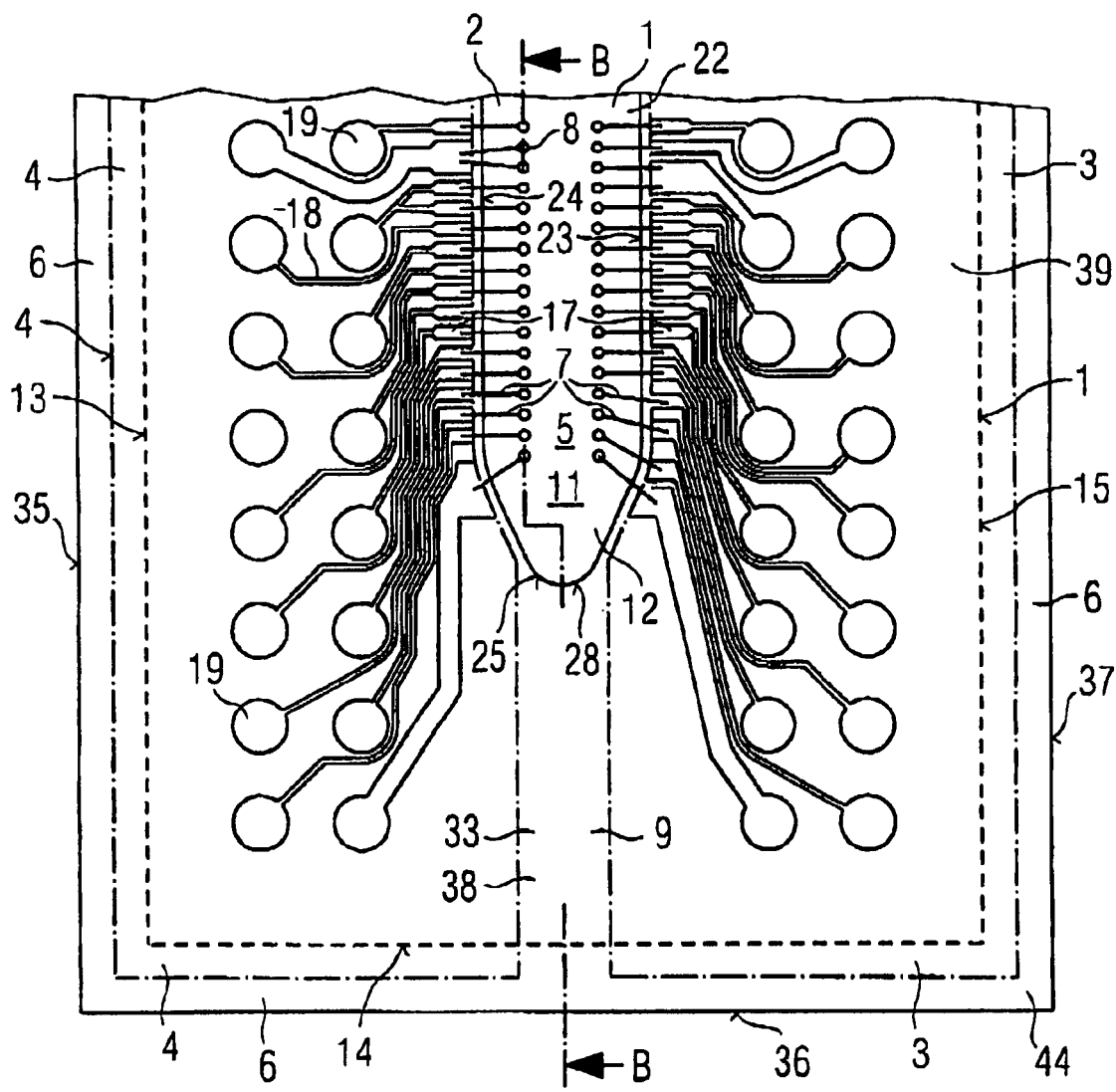
FIG. 4 is a schematic view of the lower face of a second embodiment of the electronic component according to the invention.

FIG. 4 shows a schematic view of the lower face 39 of a second embodiment of the electronic component according to the invention. The plastic cover is once again omitted, as in FIG. 1, for the sake of clarity. Components which carry out the same functions as in the previously described figures are identified by the same reference symbols and will not be explained again. The major difference between FIG. 1 and FIG. 4 is the shape of the additional cutout 12. The additional cutout 12 in the second embodiment of the invention is an extension of the through-cutout 5, whose width tapers. This tapering extension makes it possible to produce the bonding connections at the end of the through-cutout 5 with approximately the same bonding wire length, that is to say with a standard bonding wire length, which reduces the price of the production process. However, the effect of the additional cutout 11 is the same as in FIG. 1, that is to say the separating joint 9 between the adhesive strips 3 and 4 is filled with plastic compound, with plastic at the same time being removed from the plastic reservoir 12 in the additional cutout 11. The contact connecting surfaces 17 and the external contact surfaces 19 are provided with a coating which can be bonded or soldered, in this embodiment as shown in FIG. 4.

Figure 5:
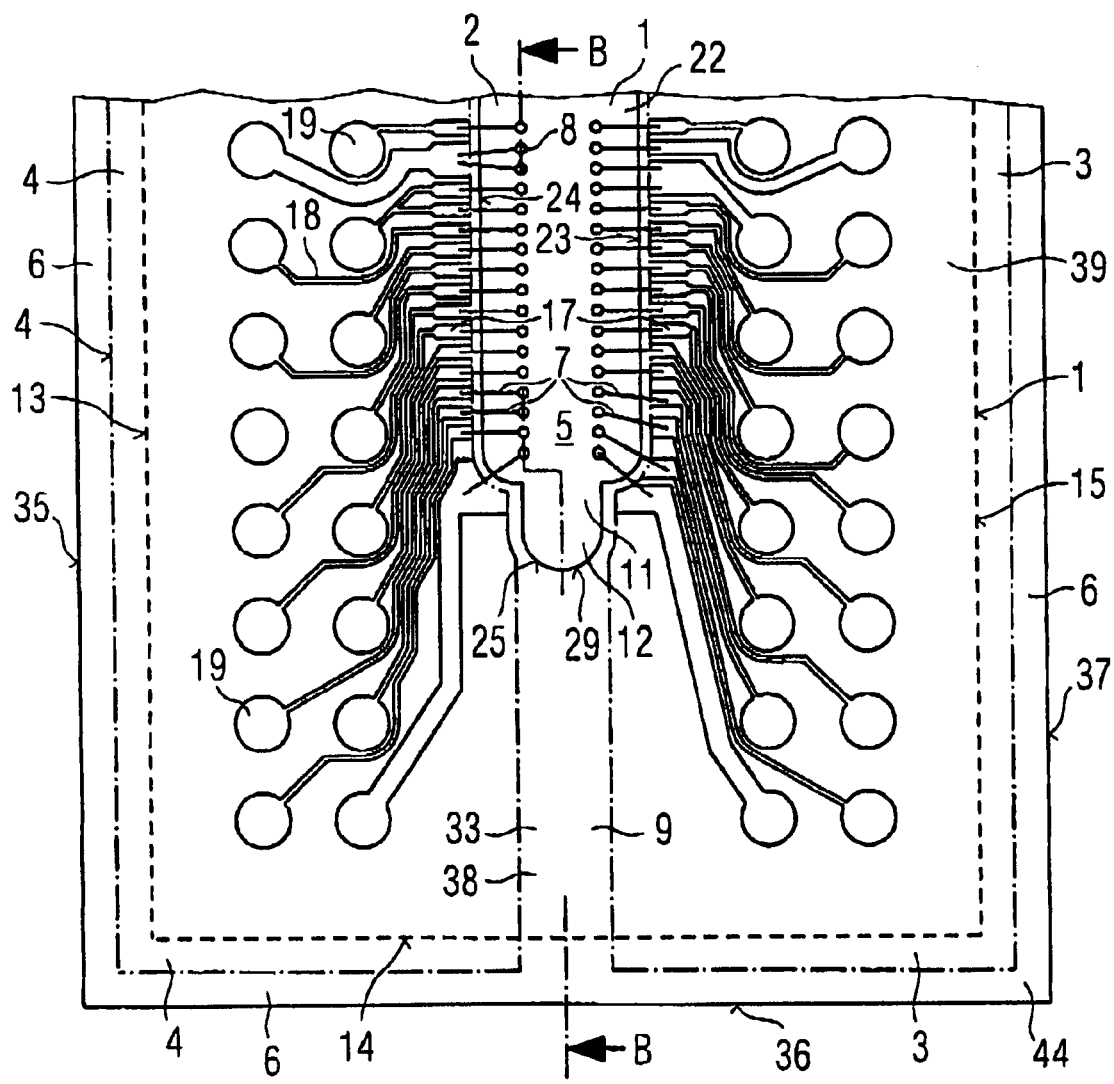
FIG. 5 is a schematic view of the lower face of a third embodiment of an electronic component according to the invention.

FIG. 5 shows a schematic view of the lower face 39 of a third embodiment of an electronic component according to the invention, but with the plastic cover omitted in order to make the illustration clearer. Components that carry out the same functions as in the above-described figures are identified by the same reference symbols, and will not be explained again. The major difference between the third embodiment shown in FIG. 5 and the embodiments 1 and 2 as shown in FIGS. 1 and 4 is that the additional cutout in this embodiment is an extension of the through-cutout 5, whose width becomes narrower. This extension of the through-cutout 5, whose width becomes narrower in order to create an additional cutout 11 and hence a plastic reservoir has the advantage that bonding connections 7 with the same bonding wire length can be applied at the end of the through-cutout 5 in the edge regions while, nevertheless, the additional cutout 11 with its plastic reservoir 12, can fill the cavity 38 of the separating joint 9 completely with plastic compound.

Figure 6:
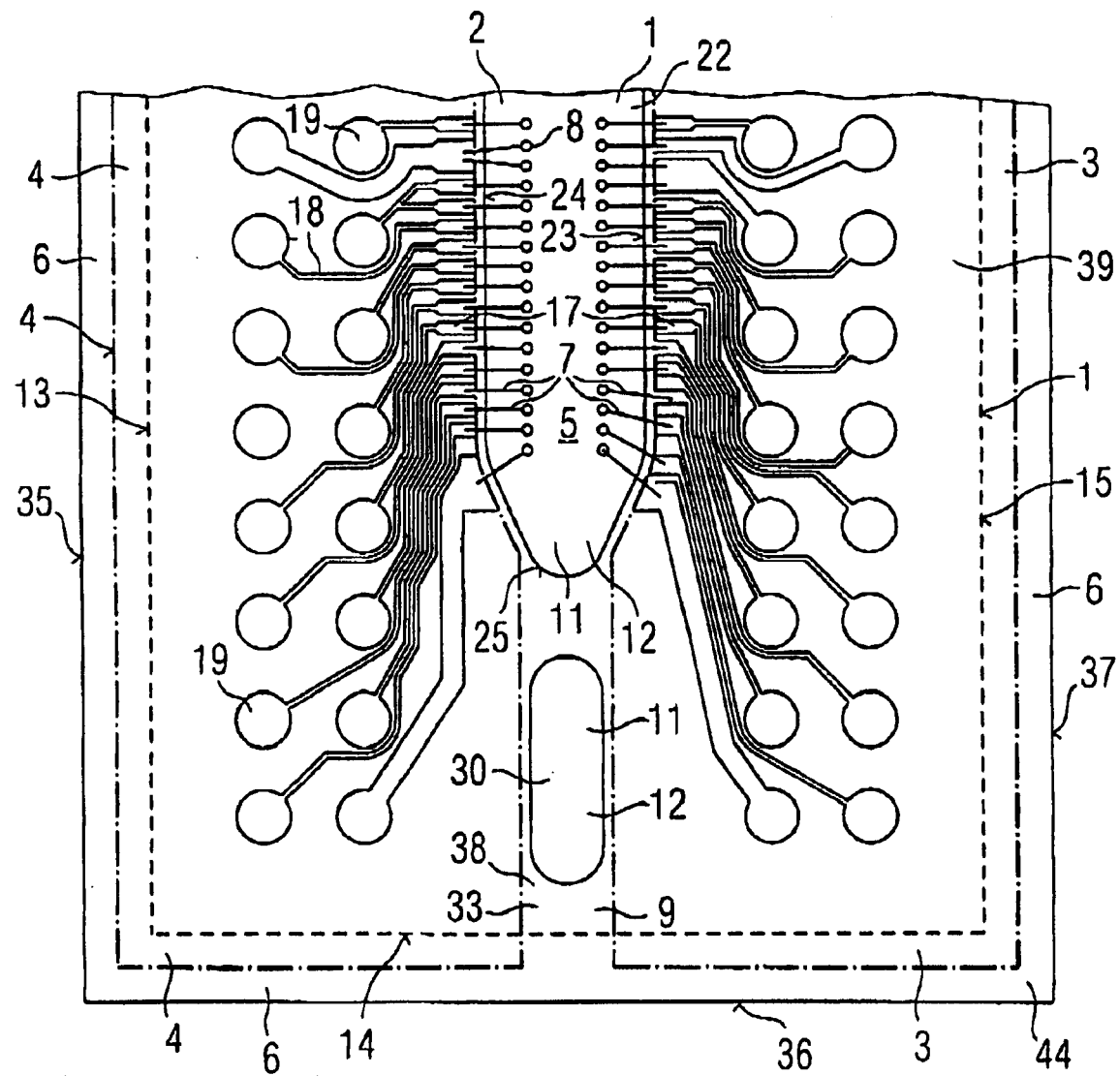
FIG. 6 is a schematic view of the lower face of a fourth embodiment of an electronic component according to the invention.

FIG. 6 shows a schematic view of the lower face 39 of a fourth embodiment of an electronic component according to the invention, with the plastic cover being omitted in order to make the illustration clearer. Components that carry out the same functions as in the above-described figures are identified by the same reference symbols and will not be explained again.

The major difference between the fourth embodiment and the first three above-described embodiments is the shape of the additional cutout 11 which in this case comprises not only an extension of the through-cutout 5, as has already been shown in FIG. 4, but also has an additional cutout 30. This additional cutout 30 is arranged directly in the surrounding wiring board 6 above the region of the separating joint 9 between the adhesive strips 3 and 4 and thus provides a plastic reservoir which is advantageous for elongated semiconductor chips 1 with a relatively short bonding channel 22. This separate additional cutout 30 is used when there is a risk of the capillary effect in the cavity not being sufficient to fill the entire cavity with plastic compound, or there is a risk of bonding connections suffering as a result of the plastic compound entering the cavity 38, that is to say not being embedded completely in plastic compound.

Figure 7:
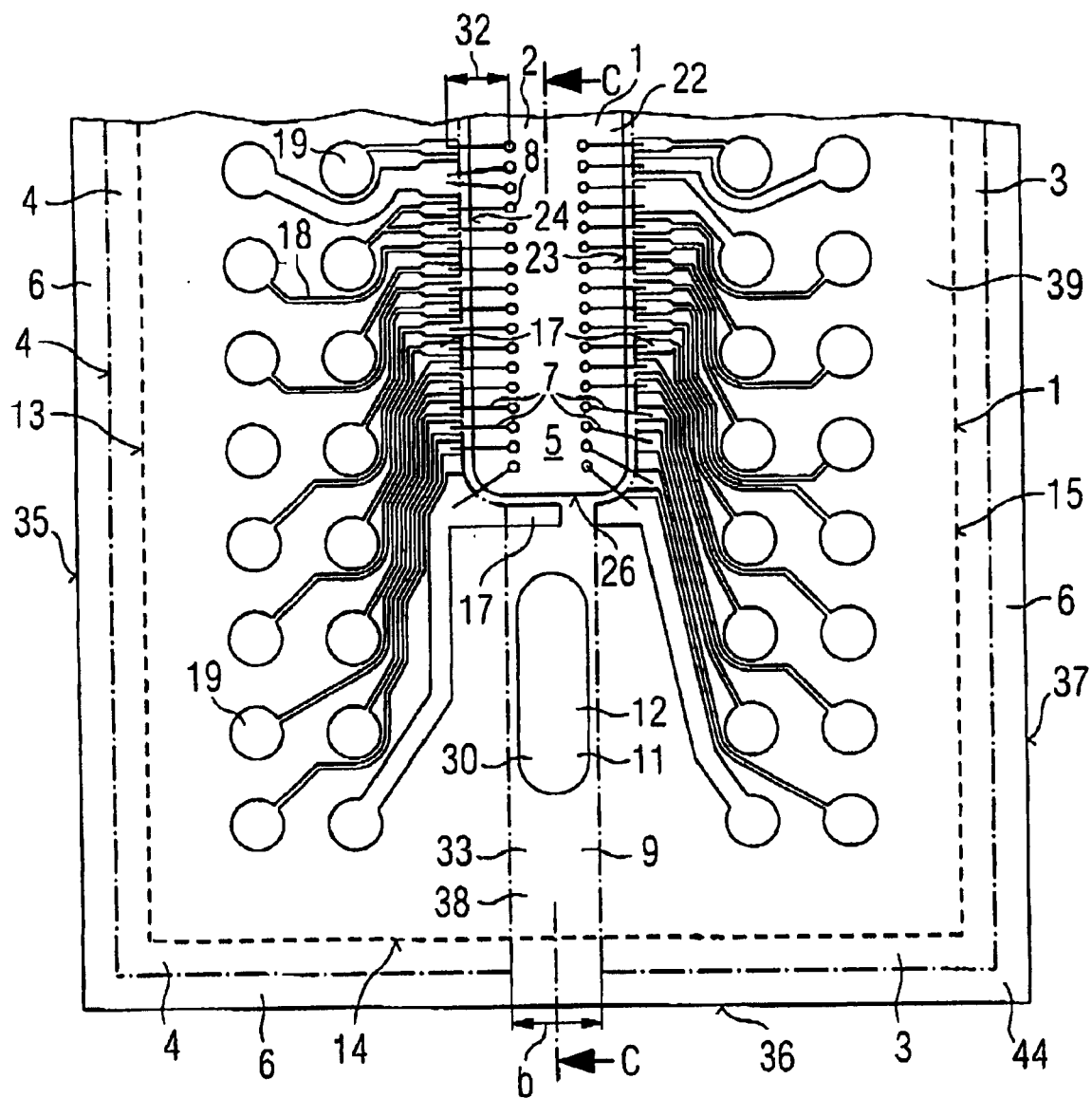
FIG. 7 is a schematic view of the lower face of a fifth embodiment of an electronic component according to the invention.

FIG. 7 shows a schematic view of the lower face 39 of a fifth embodiment of an electronic component according to the invention, with the plastic cover once again being omitted for illustration reasons. Components which carry out the same functions as in the above-described figures are identified by the same reference symbols, and will not be explained again.

The major difference between the fifth embodiment of the invention and the previous embodiments of the invention is that the transverse face 26 of the through-cutout 5 can be used over its entire width for bonding connections 7 with the same bonding wire length as on the longitudinal faces 23, 24. The use of the transverse faces 26 for bonding connections 7 makes it possible to either reduce the bonding channel length or to increase the number of bonding connections in the bonding channel 22. An additional cutout 30 which is separate from the through-cutout 5 and has a corresponding plastic reservoir which is applied at the same time as the covering of the through-cutout 5 and the embedding of the bonding connections 7 ensures adequate filling of the cavity 38 which is created by the separating joint 9 between the plastic strips 3 and 4.

FIG. 8 shows a schematic cross section through the sixth embodiment of the invention along the section line C—C in FIG. 7, but with the plastic cover on the through-cutout 5 and with the plastic reservoir 12 in the additional cutout 11 or 30. This additional cutout 30 is clearly separated from the through-cutout 5 for the bonding connections and, in this sectional illustration, only one bonding connection 7 is shown, which lies on the longitudinal axis of the semiconductor chip 1 or of the electronic component 21, and runs on the section line C—C in FIG. 7. Since a portion of the plastic compound 27 in the plastic reservoir 12 is used, by means of the capillary effect, to fill the cavities 38 between the surrounding wiring board 6 and the semiconductor chip 1 in the region of the separating joint 9, the contour of the surface 43 of the plastic reservoir 12 is slightly indented in comparison to the plastic cover 10 on the through-cutout 5. The thickness of the separating joint 9 corresponds to the thickness of the adhesive strips, which is in the range of 40 to 200 µm and, in the example shown in FIGS. 7 and 8, has a thickness k of between 100 and 120 µm. As can be seen in FIG. 7, the width of the holding webs b is between 500 and 800 µm, so that the cavity 38 has a cross section a=b·k. The thickness D of the semiconductor chip is between 100 and 800 µm and, in the embodiment shown in FIG. 8 has a thickness of between 350 and 400 µm. The thickness d of the fiber-reinforced plastic board which is used as the surrounding wiring board 6 is between 180 and 250 µm in the exemplary embodiment shown in FIGS. 7 and 8. The diameter of the bonding wire 31 is between 12 and 30 µm.

An electronic component 21 such as the embodiments illustrated in FIGS. 1 to 8, may be fabricated, for example, by way of the following production sequence:

application of two adhesive strips 3, 4 to a surrounding wiring board 6 with a through-cutout 5 and an additional cutout 11 leaving free the through-cutout 5, the additional cutout 11 and elongated separating joints 9 between the adhesive strips 3 and 4;

application of a semiconductor chip 1 to the adhesive strips 3 and 4, with the contact surfaces 8 of the semiconductor chip 1 being positioned in the through-cutout 5 in the surrounding wiring board 6;

construction of bonding connections 7 between the contact surfaces 8 on the semiconductor chip 1 and contact connecting surfaces 17 on the surrounding wiring board 6;

filling of the through-cutout 5 with the bonding connections 7 being embedded, and filling of the additional cutout 11, with the separating joint 9 being filled with a plastic compound 27.

In this case, two adhesive strips 3 and 4 are applied by stamping out the adhesive strips 3 and 4 from a double-sided adhesive tape, with the adhesive tape having a width which is suitable for producing a number of adhesive strips 3, 4 alongside one another at the same time, for a correspondingly wide surrounding wiring board for a number of semiconductor chips 1 arranged alongside one another. In order that the stamped-out cutouts for the through-cutout and the additional cutout do not fall off the adhesive tape and are positioned on the surrounding wiring board, holding webs are provided, to which the parts of the stamped-out adhesive tape for leaving free the through-cutout and the additional cutouts are attached. In this case, the sizes of the holding webs correspond to the separating joints 9 which can be seen on the surrounding wiring board 6.

We claim:

1. An electronic component, comprising:
a wiring board formed with a through-cutout;
a semiconductor chip having an active upper face and contact surfaces on said active upper face;
adhesive strips on said active upper face of said semiconductor chip and mounting said semiconductor chip to said wiring board for bonding connections to said contact surfaces said adhesive strips leaving free said through-cutout in said wiring board, and leaving free elongated separating joints between said adhesive strips on said wiring board;
said adhesive strips, said upper face of said semiconductor chip and said wiring board forming cavities adjoining said through-cutout in said wiring board; and
a plastic cover embedding said bonding connections and at least partially filling said cavities, and said wiring board having formed therein an additional cutout, with a plastic reservoir containing plastic compound adjoining said cavities said plastic reservoir being position in said wiring board laterally adjacent said through-cutout, wherein said through cutout has longitudinal faces with said boding connections, and transverse faces without bonding connections, said transverse faces are each enlarged by said additional cutout with said plastic reservoir, and the separating join that are filled with plastic compound adjoin said additional cutout in a longitudinal direction.

2. The electronic component according to claim 1, wherein said semiconductor chip has edge faces and a passive rear face opposite said active upper face, and the contact surfaces on said active upper face having a structure and an arrangement to which said through-cutout in said wiring board is matched.

3. The electronic component according to claim 1, wherein said wiring board is formed with contact connecting surfaces electrically connected via said bonding connections to said contact surfaces on said semiconductor chip, and said contact connecting surfaces are electrically connected via wiring lines and external contact surfaces to external contacts of the electronic component on said wiring board.

4. The electronic component according to claim 1, wherein said through-cutout in the wiring board is a bonding channel.

5. The electronic component according to claim 1, wherein said additional cutout is commonly and integrally formed together with said through-cutout in said wiring board.

6. The electronic component according to claim 1, wherein said additional cutout is an extension of said through-cutout, and said through-cutout tapers in a longitudinal direction of said through-cutout.

7. The electronic component according to claim 1, wherein said additional cutout is an extension of said through-cutout, and said through-cutout narrows in a longitudinal direction of said through-cutout.

8. The electronic component according to claim 1, wherein said additional cutout is arranged separately from said through-cutout.

9. The electronic component according to claim 1, wherein said through-cutout has longitudinal faces with said bonding connections, and transverse faces with said bonding connections, and wherein additional cutouts with a plastic reservoir at said separating joints are arranged separately from said through-cutout.

10. The electronic component according to claim 1, wherein said bonding connections comprise bonding wires on longitudinal faces and on transverse faces of said through-cutout, and said bonding wires have standard bonding wire lengths.

11. The electronic component according to claim 1, wherein said adhesive strips are double-sided adhesive strips with adhesive material on both sides.

12. The electronic component according to claim 1, wherein said adhesive strips have a base material with a double-sided adhesive coating.

13. The electronic component according to claim 1, wherein said adhesive strips have a thickness of between 40 µm and 200 µm.

14. The electronic component according to claim 1, wherein said wiring board has a thickness of 150 µm to 350 µm.

15. The electronic component according to claim 1, wherein said wiring board has fiber-reinforced plastic with a metal coating structured to form contact connecting surfaces, wiring lines, and external contact surfaces.

16. The electronic component according to claim 15, wherein said metal coating is composed of a metal selected from the group consisting of copper and copper alloy.

17. The electronic component according to claim 15, wherein said contact connecting surfaces and said external contact surfaces are formed with a coating that can be bonded or soldered.

18. A method for producing an electronic component, which comprises the following method steps:

providing a wiring board with a through-cutout and an additional cutout;

applying two adhesive strips to the wiring board and thereby leaving free the through-cutout, the additional cutout, and elongated separating joints between the adhesive strips;

applying a semiconductor chip thereby positioning contact surfaces of in the through-cutout in the wiring board; to the adhesive strips, and the semiconductor chip constructing bonding connections between the contact surfaces on an active upper face on the semiconductor chip and contact connecting surfaces on the wiring board;

forming cavities adjoining the through cutout in the wiring board by the adhesive strips, the active upper face of the semiconductor chip and the wiring board;

filling the through-cutout, the additional cutout, and at least partially the cavities with a plastic compound and thereby embedding the bonding connections;

providing a plastic reservoir containing plastic compound in the additional cutout adjoining the cavities, the plastic reservoir being positioned in the wiring board laterally adjacent the through cutout; and enlarging transverse faces without bonding connections of the through cutout by the additional cutout with the plastic reservoir and adjoining the separating joints filled with plastic compound with the additional cutout in a longitudinal direction.

19. The method according to claim 18, which comprises stamping out the adhesive strips from a double-sided adhesive tape, and leaving the adhesive tape with holding webs after the stamping-out process, the holding webs holding a part of the stamped-out adhesive tape that is required for leaving free the through-cutout and the additional cutouts, and wherein a dimension of the holding webs correspond to the separating joints.

20. The method according to claim 18, wherein the filling step comprises filling the separating joints with plastic compound by causing the plastic compound in liquid phase to be introduced from a plastic reservoir in the additional cutouts by way of a capillary effect into a space between the active upper face of the semiconductor chip and the upper face of the wiring board.

21. The method according to claim 18, which comprises applying bonding connections to the longitudinal faces and the transverse faces of a tape channel, while maintaining standard bonding wire lengths.

22. The method according to claim 18, which comprises forming the electronic component having the active upper face of the semiconductor chip mounted by the two adhesive strips and bond-wired to the wiring board via bonding connections, and wherein the wiring board has a plastic cover that embeds the bonding connections and fills the separating joints, and the wiring board has the additional cutout forming a plastic material reservoir adjoining the separating joints.

* * * * *

UNITED STATES PATENT AND TRADEMARK OFFICE
CERTIFICATE OF CORRECTION

PATENT NO. : 6,906,928 B2
DATED : June 14, 2005
INVENTOR(S) : Christian Hauser et al.

It is certified that error appears in the above-identified patent and that said Letters Patent is hereby corrected as shown below:

Column 12,
Line 8, should read as follows -- ing said cavities and said plastic reservoir being positioned in --.
Line 11, should read as follows -- faces with said bonding connections, and transverse --.

Signed and Sealed this

Sixth Day of September, 2005

JON W. DUDAS
*Director of the United States Patent and Trademark Office*